(12) United States Patent
Masuda et al.

(10) Patent No.: US 9,054,049 B2
(45) Date of Patent: Jun. 9, 2015

(54) DRIVING SUBSTRATE AND DISPLAY DEVICE

(71) Applicant: Sony Corporation, Tokyo (JP)

(72) Inventors: Kenta Masuda, Kanagawa (JP); Keiichi Akamatsu, Kanagawa (JP); Yuichi Kato, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/246,802

(22) Filed: Apr. 7, 2014

(65) Prior Publication Data

US 2014/0220781 A1    Aug. 7, 2014

Related U.S. Application Data

(62) Division of application No. 13/679,409, filed on Nov. 16, 2012, now Pat. No. 8,759,849.

(30) Foreign Application Priority Data

Dec. 14, 2011    (JP) ................................. 2011-273548

(51) Int. Cl.
*H01L 21/3105* (2006.01)
*H01L 27/12* (2006.01)
*H01L 23/28* (2006.01)

(52) U.S. Cl.
CPC .......... *H01L 21/31055* (2013.01); *H01L 23/28* (2013.01); *H01L 27/1218* (2013.01); *H01L 27/1262* (2013.01)

(58) Field of Classification Search
CPC ................... H01L 21/31055; H01L 21/76801; H01L 21/311; H01L 27/1262; H01L 27/1214; H01L 27/12
USPC ......................................... 438/697, 464, 689
See application file for complete search history.

(56) References Cited

U.S. PATENT DOCUMENTS

| | | | |
|---|---|---|---|
| 5,006,202 A * | 4/1991 | Hawkins et al. | ................. 216/27 |
| 7,973,319 B2 | 7/2011 | Kashiwabara et al. | |
| 2003/0228759 A1 | 12/2003 | Uehara et al. | |
| 2013/0117698 A1 | 5/2013 | Park et al. | |

FOREIGN PATENT DOCUMENTS

| | | |
|---|---|---|
| JP | H06-077182 | 3/1994 |
| JP | H06-085059 | 3/1994 |
| JP | H09-008007 | 1/1997 |
| JP | 2002-252195 A | 9/2002 |
| JP | 2004-050711 | 2/2004 |
| JP | 2004-058415 | 2/2004 |
| JP | 2005-030798 | 2/2005 |

* cited by examiner

*Primary Examiner* — Nikolay Yushin
(74) *Attorney, Agent, or Firm* — Sony Corporation

(57) ABSTRACT

A driving substrate includes: a protective layer including an etching surface; and a film layer including one or more convex portions on a surface thereof. The film layer is in contact with a rear surface of the protective layer. The one or more convex portions each have a surface being flush with the etching surface.

15 Claims, 11 Drawing Sheets

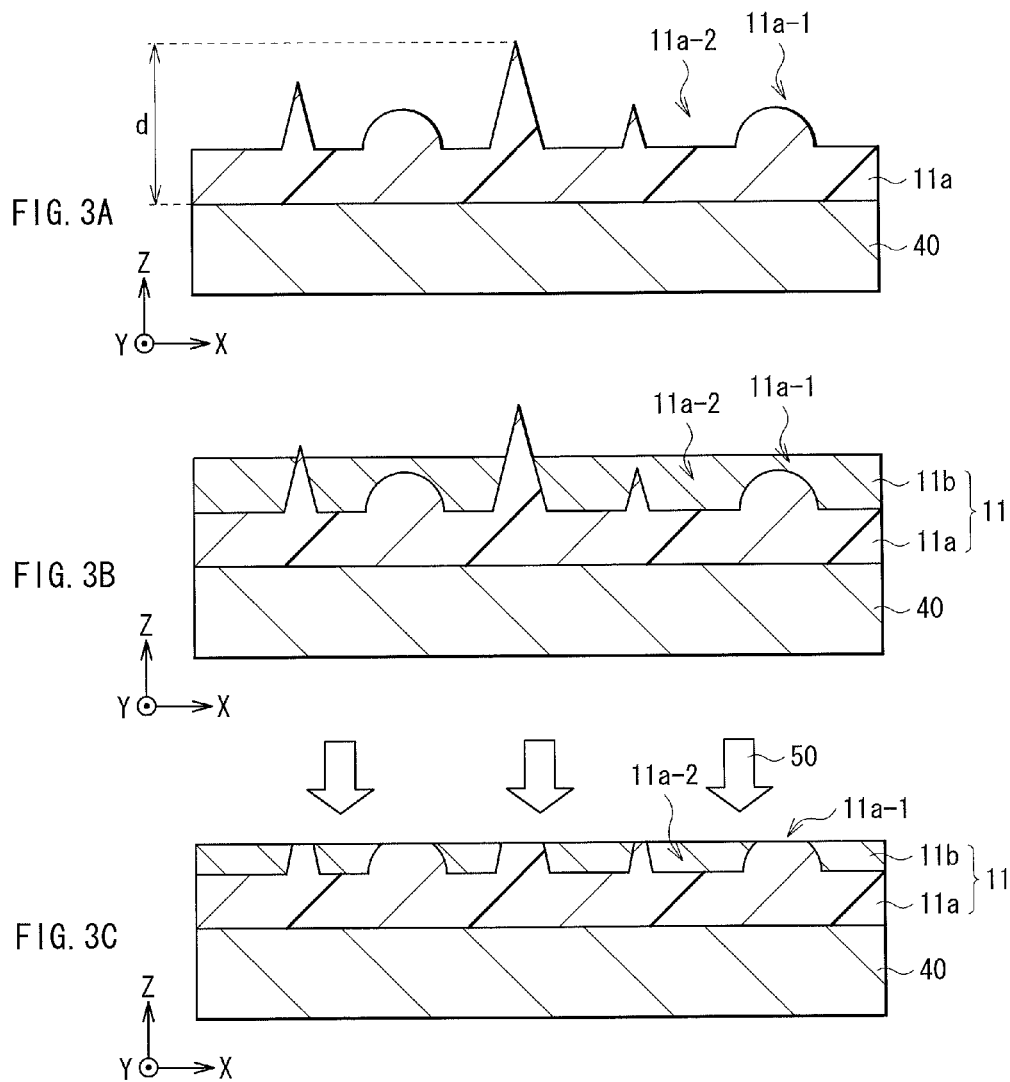

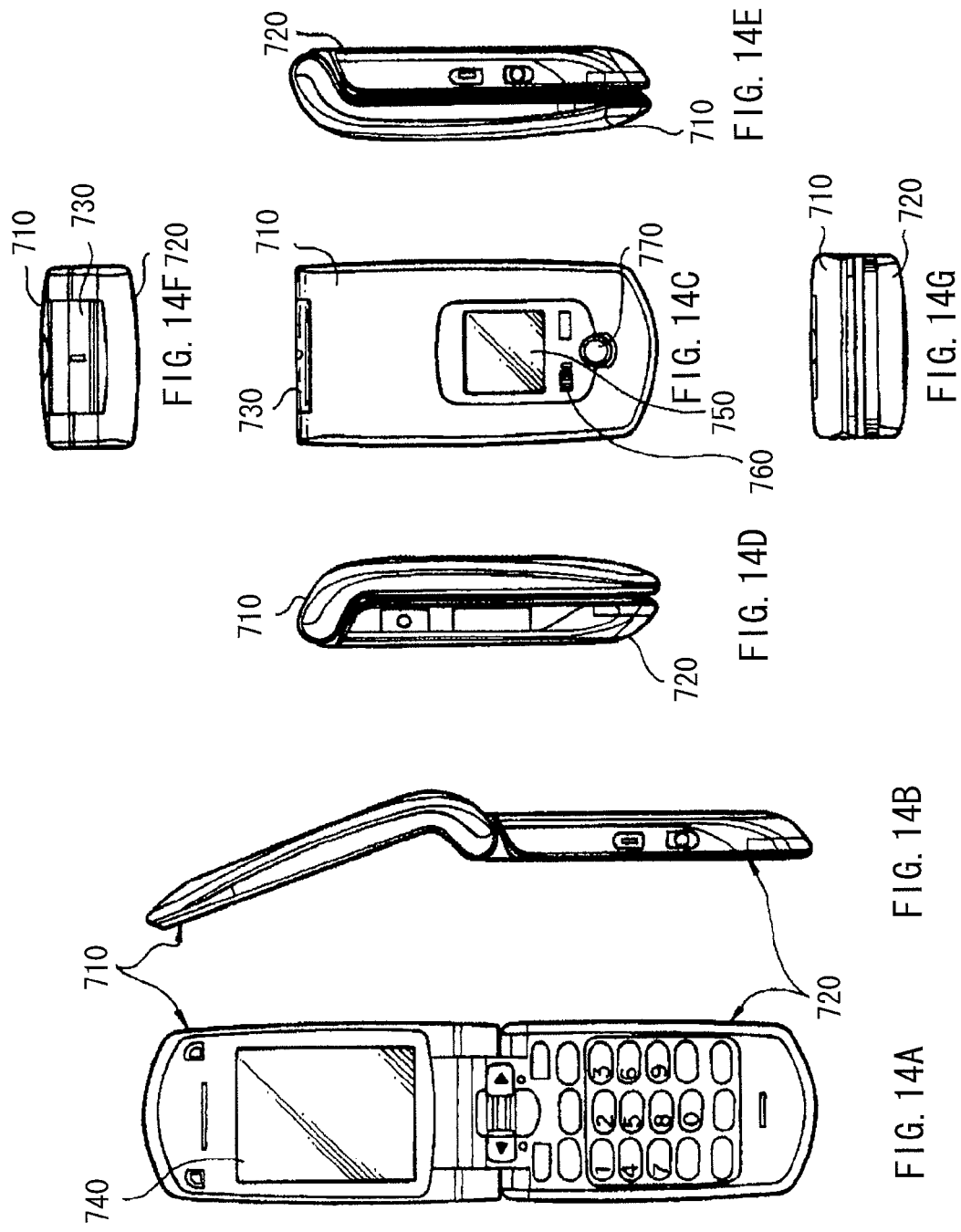

DRIVING SUBSTRATE AND DISPLAY DEVICE

CROSS-REFERENCE TO RELATED APPLICATIONS

The present application is a divisional application of U.S. patent application Ser. No. 13/679,409 filed Nov. 16, 2012, which claims priority from Japanese Patent Application JP 2011-273548 filed in the Japan Patent Office on Dec. 14, 2011.

Each of the above referenced applications is hereby incorporated by reference in its entirety.

BACKGROUND

The present technology relates to a planarizing method suitable for a substrate including a resin material, and to a method of manufacturing a driving substrate using the planarizing method. In addition thereto, the present technology relates to a driving substrate and to a display device.

In recent years, a technology has been studied in which, as a substrate which does not crack easily and has flexibility, a film including a resin material (resin film) is used to form a driving substrate of a display device and the like. However, such a resin film has micro concavities and convexities on the surface thereof. Therefore, disconnection and short circuit occasionally occur at a wiring line of a driving circuit provided on the resin film.

For this reason, it is necessary to carry out a step of planarizing a resin film before forming a wiring line and a thin film transistor that configure a driving circuit. Although some methods of planarizing by etching and polishing have been provided (for example, Japanese Unexamined Patent Application Publication Nos. H06-77182, H06-85059, H09-8007, 2002-252195, 2004-50711, 2004-58415, and 2005-30798), it is difficult to put such methods into practical use because of cost issue posed by long production time, small process area, and the like.

In view of this, Japanese Unexamined Patent Application Publication No. 2005-30798 proposes, for practical use, a method in which a protective layer having high etching resistance is provided on a surface of a resin film, and only a convex portion of the resin film protruding from the protective layer is removed by etching.

SUMMARY

However, even in the case where the method disclosed in the above-mentioned Japanese Unexamined Patent Application Publication No. 2005-30798 is used, planarizing of a surface of a resin film is insufficient, and the issue of disconnection and short circuit remains unsolved.

It is desirable to provide a planarizing method capable of suppressing disconnection, short circuit, and the like of a wiring line and the like, and a method of manufacturing a driving substrate using the planarizing method. In addition thereto, it is desirable to provide a driving substrate and a display device in which disconnection, short circuit, and the like of a wiring line are suppressed.

A planarizing method of an embodiment of the present technology includes: forming a substrate by providing a protective layer on a film layer, the protective layer and the film layer having substantially same etching resistance, and the film layer including one or more convex portions on a surface thereof; and planarizing a surface of the substrate by etching the one or more convex portions of the film layer together with the protective layer.

A method of manufacturing a driving substrate of an embodiment of the present technology includes: forming a substrate by providing a protective layer on a film layer, the protective layer and the film layer having substantially same etching resistance, and the film layer including one or more convex portions on a surface thereof; and planarizing a surface of the substrate by etching the one or more convex portions of the film layer together with the protective layer; and forming a driving circuit on the planarized surface of the substrate.

In the planarizing method and the method of manufacturing a driving substrate of the embodiment of the present technology, since the etching resistance of the protective layer is substantially the same as that of the film layer, there is less possibility that only one of the film layer and the protective layer is deeply etched.

A driving substrate of the embodiment of the present technology includes: a protective layer including an etching surface; and a film layer including one or more convex portions on a surface thereof, the film layer being in contact with a rear surface of the protective layer, the one or more convex portions each having a surface being flush with the etching surface.

A display device includes a driving substrate and a display layer. The driving substrate includes: a protective layer including an etching surface; and a film layer including one or more convex portions on a surface thereof, the film layer being in contact with a rear surface of the protective layer, the one or more convex portions each having a surface being flush with the etching surface.

According to the planarizing method and the method of manufacturing a driving substrate of the embodiment of the present technology, since the protective layer and the film layer are configured to have substantially the same etching resistance, there is less possibility that only one of the film layer and the protective layer is deeply etched, and the flatness of the substrate is improved. According to the driving substrate and the display device of the embodiment of the present technology, since the surface of the convex portion of the film layer is flush with the etching surface of the protective layer, it is possible to improve the flatness of the substrate. Consequently, it is possible to suppress occurrence of disconnection, short circuit, and the like of the wiring line.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

FIG. 3A is a sectional view showing a method of manufacturing the substrate illustrated in FIGS. 2A and 2B.

FIG. 3B is a sectional view showing a method of manufacturing the substrate illustrated in FIGS. 2A and 2B.

FIG. 3C is a sectional view showing a method of manufacturing the substrate illustrated in FIGS. 2A and 2B.

FIG. 14A is a front elevational view of an application example 6 in an unfolded state, FIG. 14B is a side view thereof, FIG. 14C is a front view in a folded state, FIG. 14D is a left side view, FIG. 14E is a right side view, FIG. 14F is a top view, and FIG. 14G is a bottom view.

DETAILED DESCRIPTION

With reference to the drawings, an embodiment of the present technology will be described in detail below. It is to be noted that, the description will be made in the following order.

1. Embodiment
Display Device Provided with Driving Substrate Including Film Layer and Protective Layer
2. Application Examples

Embodiment

Figure 1:
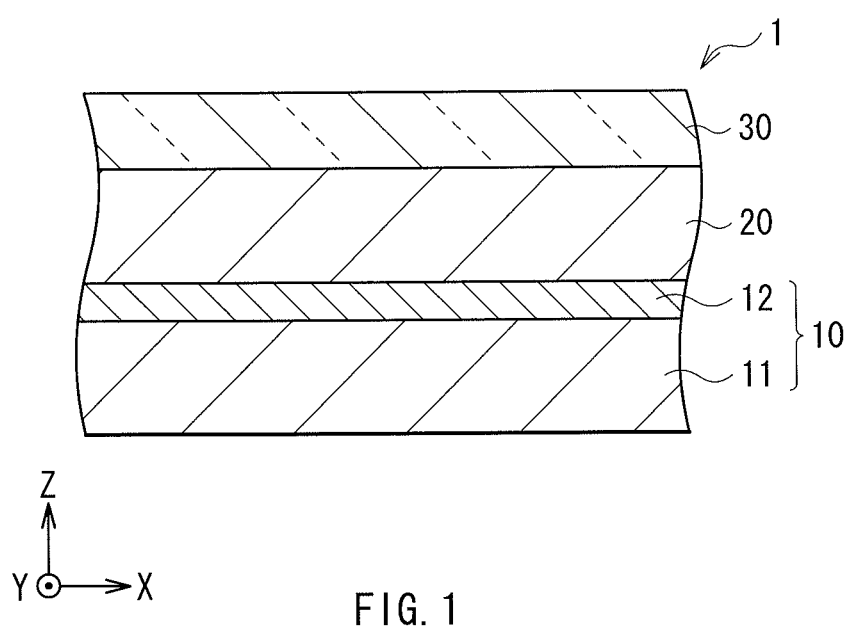
FIG. 1 is a sectional view showing a configuration of a display device according to an embodiment of the present disclosure.

FIG. 1 shows a cross-sectional configuration of a display device (display device 1) according to an embodiment of the present disclosure. The display device 1 includes a driving substrate 10, a display layer 20, and an opposing substrate 30 in this order. An image is displayed on the opposing substrate 30 side. The driving substrate 10 includes a substrate 11 and a TFT layer 12 as a driving circuit. The TFT layer 12 is provided on the surface (surface facing the display layer 20) of the substrate 11.

Figure 2A:
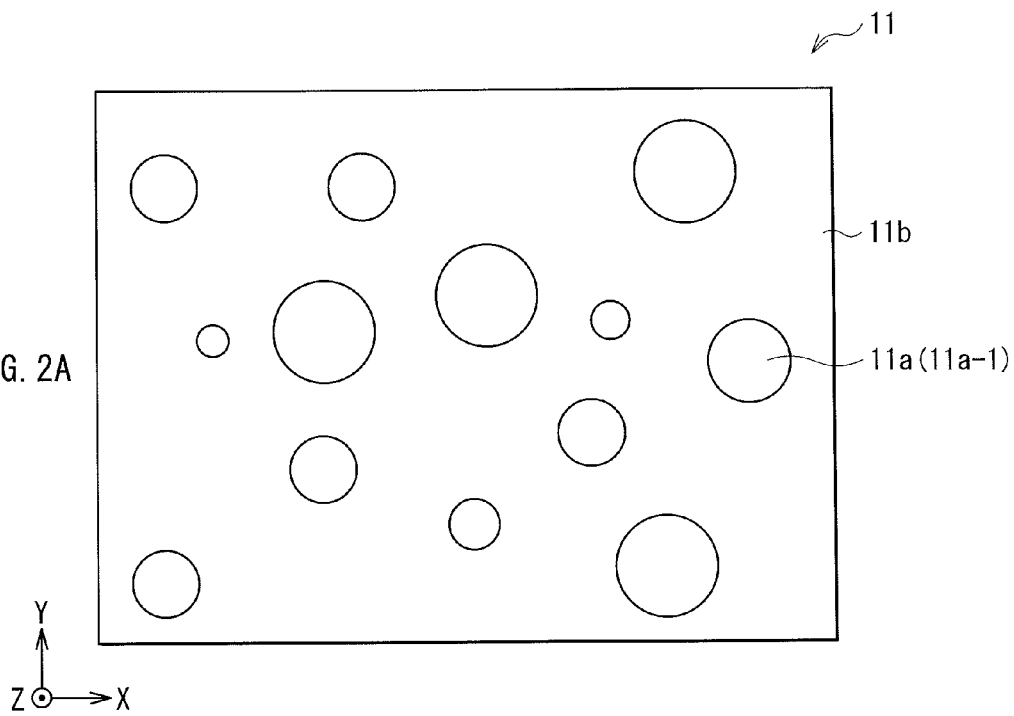
FIG. 2A is a diagram showing a configuration of a substrate illustrated in FIG. 1.
Figure 2B:
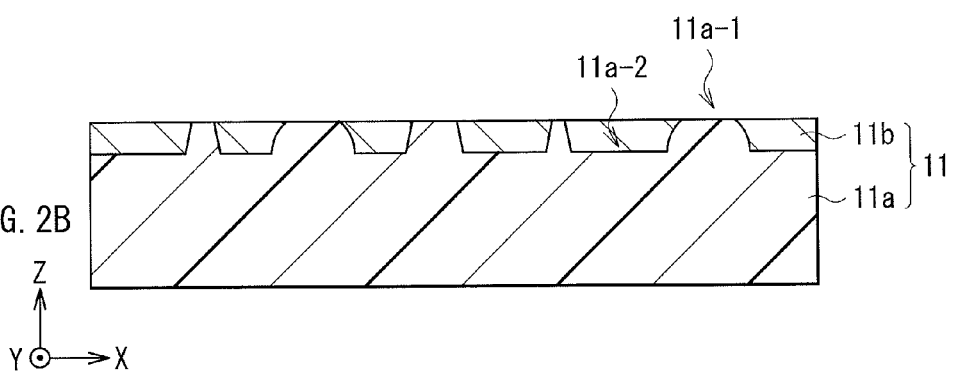
FIG. 2B is a diagram showing a configuration of a substrate illustrated in FIG. 1.

As shown in FIGS. 2A and 2B, the substrate 11 is made up of a film layer 11a and a protective layer 11b. FIG. 2A schematically shows a planar configuration of the substrate 11, and FIG. 2B schematically shows a cross-sectional configuration of the substrate 11. The film layer 11a, which is a main component of the substrate 11, includes on a surface thereof a plurality of convex portions 11a-1 and a plurality concave portions 11a-2 between the convex portions 11a-1. The protective layer 11b is provided in the concave portions 11a-2 of the film layer 11a so as to fill the concave portions, and the film layer 11a is in contact with a rear surface of the protective layer 11b. On the other hand, a surface of the protective layer 11b is flush with surfaces of the convex portions 11a-1 of the film layer 11a. In other words, the film layer 11a is covered by the protective layer 11b, and the convex portions 11a-1 of the film layer 11a is exposed from the surface of the protective layer 11b (FIG. 2A). The surfaces of the convex portions 11a-1 of the film layer 11a exposed from the protective layer 11b and the surface of the protective layer 11b are formed by etching (etching surface). Although details are described later, by etching both the film layer 11a and the protective layer 11b in this manner, it is possible to improve flatness of the surface of the substrate 11. It is to be noted that, a micro convex portion 11a-1 of the film layer 11a that is not exposed but wholly buried by the protective layer 11b may exist, and the number of the convex portions 11a-1 may be one.

The film layer 11a is flexible, and is made of a resin material having a thickness (a thickness in the lamination direction, hereinafter referred to simply as "thickness") of about 5 to 50 μm, for example. Specifically, the film layer 11a is made of, for example, polyethylene terephthalate (PET), polyethylene naphthalate (PEN), polyether sulfone (PES), polyetherimide, polyetheretherketone (PEEK), polyphenylene sulfide, polyarylate, polyimide, polyamide, polycarbonate (PC), cellulose triacetate, polyolefin, polystyrene, polyethylene, polypropylene, polymethyl methacrylate (PMMA), polyvinyl chloride, polyvinylidene chloride, epoxy resin, phenol resin, urea resin, melamine resin, silicone resin, acrylic resin, or the like. With the film layer 11a made of the above-mentioned flexible materials, it is possible to improve the durability and flexibility of the display device 1.

The protective layer 11b is made of a material having etching resistance similar to that of the material configuring the film layer 11a. For example, it is more preferable that the materials configuring the protective layer 11b and the film layer 11a have similar skeletons or the same skeleton, and that the etching resistance thereof be substantially the same. It is to be noted that "etching resistance is substantially the same" refers not only to a case in which etching resistance is exactly the same but also to a case in which etching resistance has a difference (gap) which causes no disconnection, short circuit, and the like of a wiring line on an etching surface. Since the etching resistance of the protective layer 11b is similar to that of the film layer 11a in the present embodiment, it is possible to etch the convex portions 11a-1 of the film layer 11a together with the protective layer 11b, thereby improving the flatness of the surface of the substrate 11. The protective layer 11b is made of a resist having a thickness of about 0 to 2 μm, for example. This resist is used in photolithography. Specifically, for example, if the film layer 11a is made of XENOMAX (registered trademark) available from Toyobo Co., Ltd, then the protective layer 11b may be configured by TFR970 available from Tokyo Ohka Kogyo Co., Ltd.

The TFT layer 12 has a function as a switching element for selecting pixels, and includes a TFT including a gate electrode, a gate insulating film, a channel layer, and a source-drain electrode (wiring line), and other wiring lines. The TFT may be either an inorganic TFT using an inorganic semiconductor layer as a channel layer, or an organic TFT using an organic semiconductor layer as a channel layer. By using an organic TFT to configure the TFT layer 12, it is possible to enhance the flexibility of the display device 1.

A barrier layer (not illustrated) may be provided between the substrate 11 and the TFT layer 12 in order to prevent the TFT layer 12 and the display layer 20 from being degraded by moisture, organic gas, and the like. When the flatness of the substrate 11 increases, the coverage of the barrier layer expands, and the barrier property thereof improves. The barrier layer is made of, for example, AlOxN1-X (where X=0.01 to 0.2) or silicon nitride (Si3N4).

The display layer 20 is provided between the driving substrate 10 and the opposing substrate 30, and is driven by the TFT layer 12 of the driving substrate 10. The display layer 20 includes a display body between a pixel electrode on the driving substrate 10 side and a common electrode on the opposing substrate 30 side, for example. Examples of this display body include a liquid crystal layer, an organic EL (electroluminescence) layer, an inorganic EL layer, an electrophoretic display element, and the like.

The opposing substrate 30 is provided to face the driving substrate 10 with the display layer 20 therebetween. In the display device 1, since a display face is provided on a surface, of the opposing substrate 30, opposite to a face thereof facing the driving substrate 10, the opposing substrate 30 is made of a transparent material. Except for this point, a material similar to that of the substrate 11 may be used to form the opposing substrate 30. It is also possible to provide, on the opposing substrate 30, a moisture-proof film for preventing moisture from infiltrating into the display layer 20 and an optical functional film for preventing external light from being reflected on the display face.

The display device 1 is manufactured in the following manner, for example.

Figure 4:
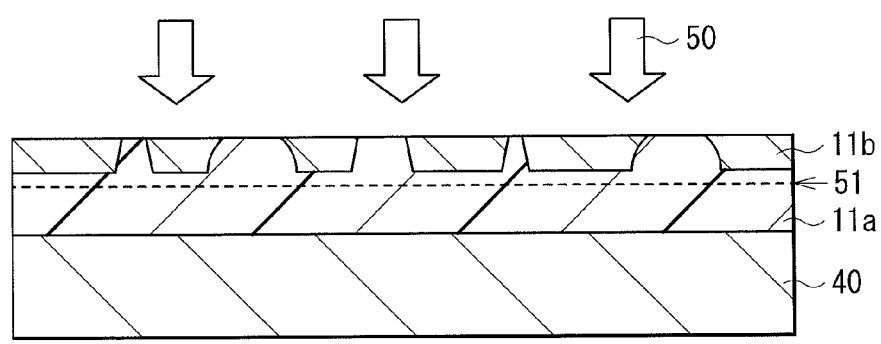
FIG. 4 is a sectional view showing an exemplary step subsequent to FIG. 3C.
Figure 5:
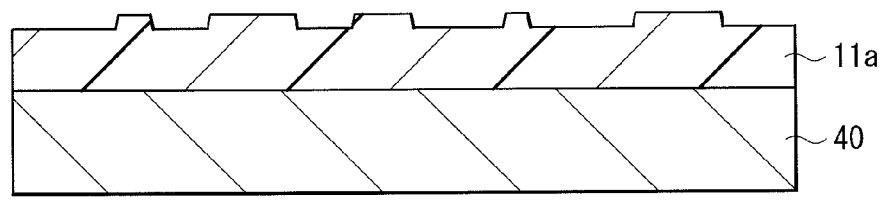
FIG. 5 is a sectional view showing another exemplary step subsequent to FIG. 3C.

First, the substrate 11 is formed, and is then planarized. FIG. 3A is a sectional view showing a method of manufacturing the substrate illustrated in FIGS. 2A and 2B. Specifically, first, as shown in FIG. 3A, the entire rear surface of the film layer 11a made of polyimide is bonded to, for example, a supporting substrate 40 made of glass having a thickness of 0.7 mm with use of an adhesive agent. Thus, a distance d in the thickness (Z-axis) direction of the film layer 11a as a whole is decreased. Next, for example, the protective layer 11b made of a resist based on polyimide (for example, TFR970 available from Tokyo Ohka Kogyo Co., Ltd) is formed on the film layer 11a by, for example, a spin coating method, a slit coating method, or the like in such a manner as to make the surface thereof flat (FIG. 3B), and the substrate 11 is thereby formed. FIG. 3B is a sectional view showing a method of manufacturing the substrate illustrated in FIGS. 2A and 2B. After the substrate 11 is formed, the protective layer 11b is etched together with the convex portions 11a-1 of the film layer 11a as shown in FIG. 3C. FIG. 3C is a sectional view showing a method of manufacturing the substrate illustrated in FIGS. 2A and 2B. In this manner, an etching surface is formed on the protective layer 11b. Thus, in the present embodiment, the surfaces of part or all of the convex portions 11a-1 of the film layer 11a, and the surface of the protective layer 11b configure the same plane, and the surface of the substrate 11 is planarized. As for the etching, for example, dry etching is performed in which plasma 50 (FIG. 3C) including oxygen (O), fluorine (F), argon (Ar), and/or the like is irradiated under vacuum. Wet etching may be employed instead of dry etching. The etching may be stopped in the state where the protective layer 11b still exists (FIG. 3C), or alternatively, the etching may be performed until reaching a stop surface 51 so that the protective layer 11b is completely removed together with the convex portions 11a-1 of the film layer 11a as shown in FIG. 4. In addition, the protective layer 11b may be removed after the etching, as shown in FIG. 5. In terms of use efficiency of the film layer 11a and working hours, it is preferable that the substrate 11 be used as the driving substrate 10 in the state where the protective layer 11b exists. Before the planarization, the film layer 11a has concavities and convexities of, for example, 0.5 to 3 μm, and after the planarization, the concavities and convexities of the film layer 11a are decreased to, for example, about 0.1 to 0.2 μm.

Figure 6A:
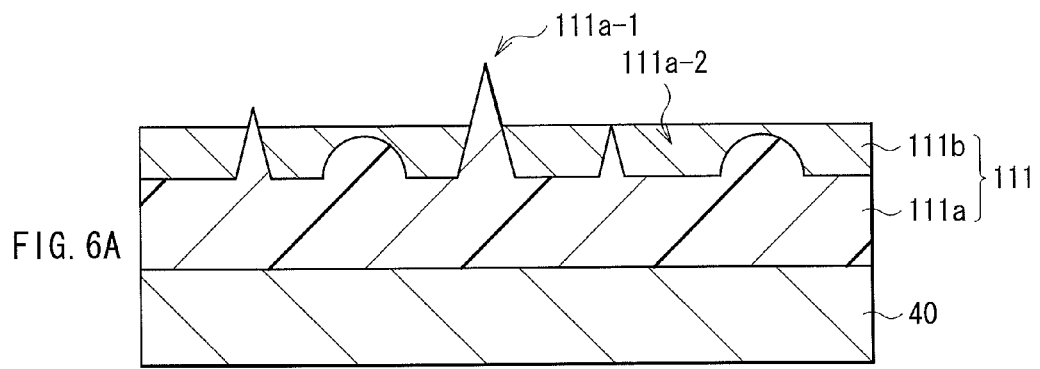
FIG. 6A is a sectional view showing a method of manufacturing a substrate according to a comparative example.
Figure 6B:
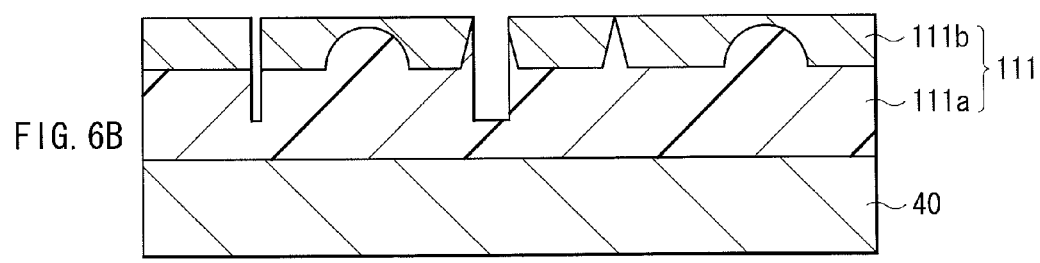
FIG. 6B is a sectional view showing a method of manufacturing a substrate according to a comparative example.
Figure 6C:
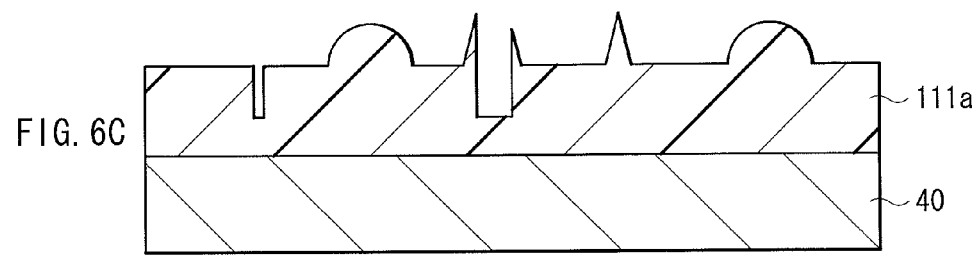
FIG. 6C is a sectional view showing a method of manufacturing a substrate according to a comparative example.

FIGS. 6A, 6B and 6C are sectional views showing a method of planarizing a substrate (substrate 111) according to a comparative example. In this method, a protective layer 111b having etching resistance higher than that of a material configuring a film layer 111a is formed on the film layer 111a (FIG. 6A), and thereafter only convex portions 111a-1 of the film layer 111a protruded from the surface of the protective layer 111b are etched to planarize the substrate 111. However, in this method, there is a possibility that only the film layer 111a, which is easier to etch than the protective layer 111b, is deeply etched while the protective layer 111b is not etched, and consequently the concavities and convexities of the film layer 111a may be increased as compared with those before the etching, as shown in FIG. 6B and FIG. 6C.

In contrast, since, in the present embodiment, the etching resistance of the material configuring the protective layer 11b is similar to that of the film layer 11a, and the protective layer 11b is etched together with the convex portions 11a-1 of the film layer 11a, it is possible to prevent the possibility that only the film layer 11a is deeply etched, and thus to planarize the surface of the substrate 11. In addition, by etching the protective layer 11b together with the film layer 11a, the concavities and convexities of the surface of the protective layer 11b are decreased, and the flatness thereof is thereby enhanced.

Figure 7A:
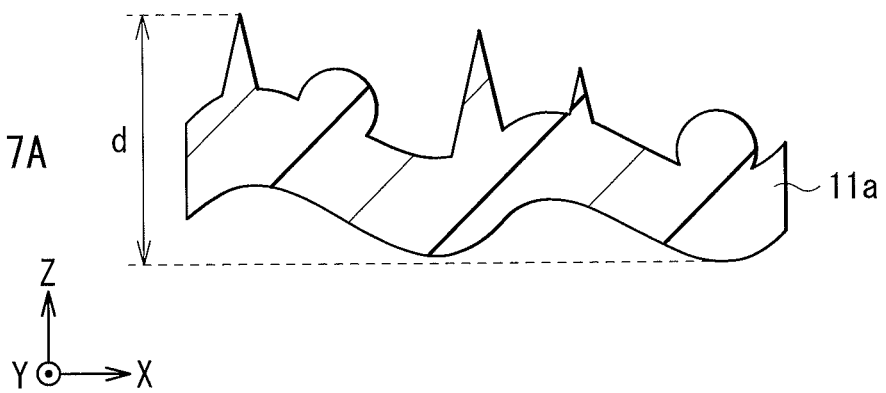
FIG. 7A is a sectional view for describing the steps illustrated in FIGS. 3A to 3C.
Figure 7B:
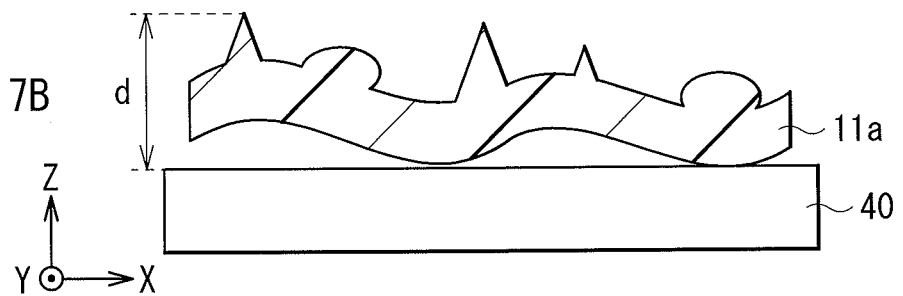
FIG. 7B is a sectional view for describing the steps illustrated in FIGS. 3A to 3C.
Figure 8A:
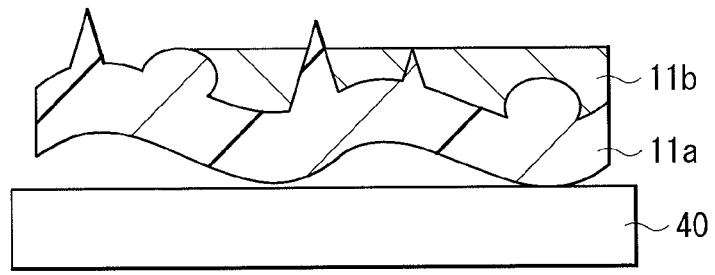
FIG. 8A is a sectional view showing a step subsequent to FIG. 7B.
Figure 8B:
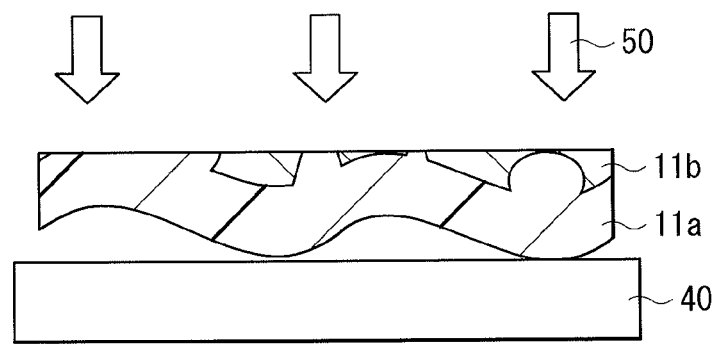
FIG. 8B is a sectional view showing a step subsequent to FIG. 8A.
Figure 8C:
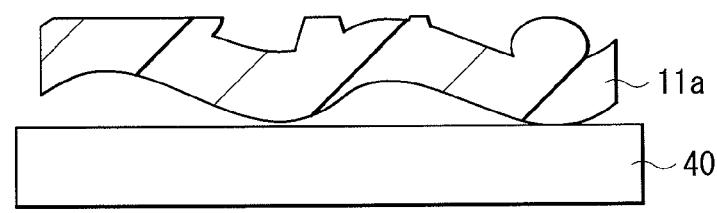
FIG. 8C ia a sectional view showing a step subsequent to FIG. 8B.

Further, the protective layer 11b is preferably formed in the state where the distance d of the film layer 11a as a whole is decreased as much as possible, as described above. FIG. 7A is a sectional view for describing the steps illustrated in FIGS. 3A to 3C. FIG. 7B is a sectional view for describing the steps illustrated in FIGS. 3A to 3C. In the state where the film layer 11a is not fixed to the supporting substrate 40 (FIG. 7A), or where the film layer 11a is only partially bonded to the supporting substrate 40 (FIG. 7B), since the film layer 11a waves in the Z-axis direction, the distance d may be increased. Consequently, the protective layer 11b may be ununiformly formed in an extreme manner as shown in FIG. 8A. FIG. 8A is a sectional view showing a step subsequent to FIG. 7B. In this case, a large difference in etching rate occurs in the substrate 11. In addition, when the distance d of the film layer 11a is excessively large, troubles such as abnormal electric discharge and deformation of the film layer 11a in a processing apparatus such as a vacuum apparatus that is used in etching (FIG. 8B) may be caused, and consequently the substrate 11 may not be planarized sufficiently (FIG. 8C), for example. FIG. 8B is a sectional view showing a step subsequent to FIG. 8A. FIG. 8C is a sectional view showing a step subsequent to FIG. 8B.

After the substrate 11 is planarized, a TFT and a wiring line (the TFT layer 12) are formed on the surface of the substrate 11. In this manner, the driving substrate 10 is formed. In this case, since the substrate 11 is planarized, it is possible to prevent disconnection, short circuit, and the like of an electrode of the TFT and other wiring lines.

After the driving substrate 10 is formed, the display layer 20 and the opposing substrate 30 are formed on the driving substrate 10. Finally, the supporting substrate 40 is peeled from the driving substrate 10, and the display device 1 illustrated in FIG. 1 is completed.

As described above, in the display device 1 of the present embodiment, since the protective layer 11*b* is etched together with the convex portions 11*a*-1 of the film layer 11*a* in the planarizing step of the substrate 11, there is less possibility that only the film layer 11*a* is deeply etched. Therefore, it is possible to improve the flatness of the substrate 11. Consequently, it is possible to prevent disconnection, short circuit, and the like of the TFT layer 12 and the like, and thus to increase the reliability of the display device 1.

Further, since the protective layer 11*b* is formed after the film layer 11*a* is fixed to the supporting substrate 40, it is possible to uniformly form the protective layer 11*b* on the film layer 11*a*, and in addition thereto, it is possible to prevent troubles in the processing apparatus.

The above-mentioned display device 1 may be mounted to electronic apparatuses illustrated in application examples 1 to 6, for example.

Application Example 1

Figure 9A:
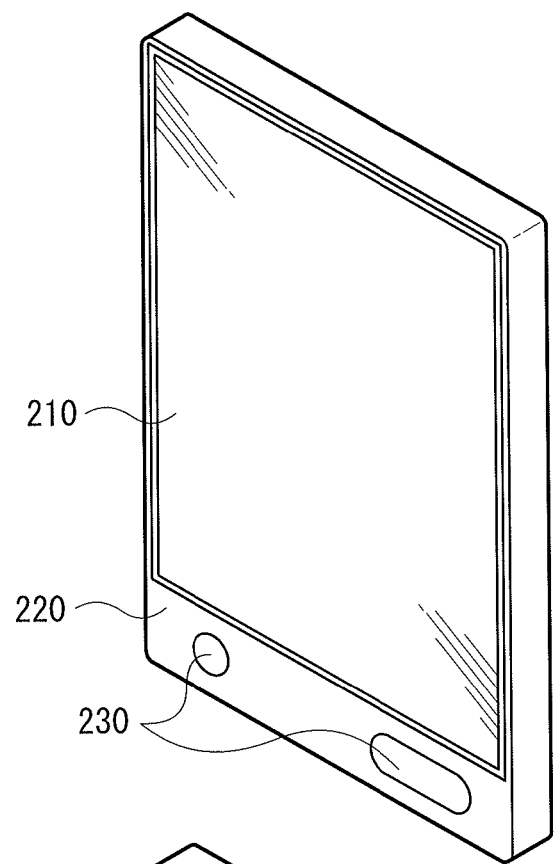
FIG. 9A is a perspective view showing an external appearance of an application example 1.
Figure 9B:
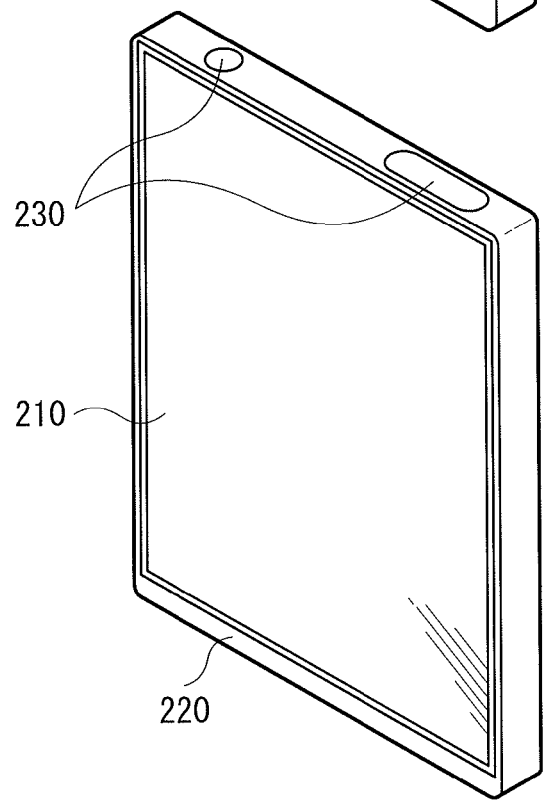
FIG. 9B ia a perspective view showing an external appearance of an application example 1.

FIG. 9A shows an external appearance of an electronic book. FIG. 9A FIG. 9B also shows an external appearance of the electronic book. This electronic book includes, for example, a display section 210, a non-display section 220, and an operation section 230. This display section 210 is configured of the above-mentioned display device 1. The operation section 230 may be formed on the same face (front face) as the display section 210 as illustrated in FIG. 9A, or may be formed on a face (top face) different from the display section 210 as illustrated in FIG. 9B.

Application Example 2

Figure 10:
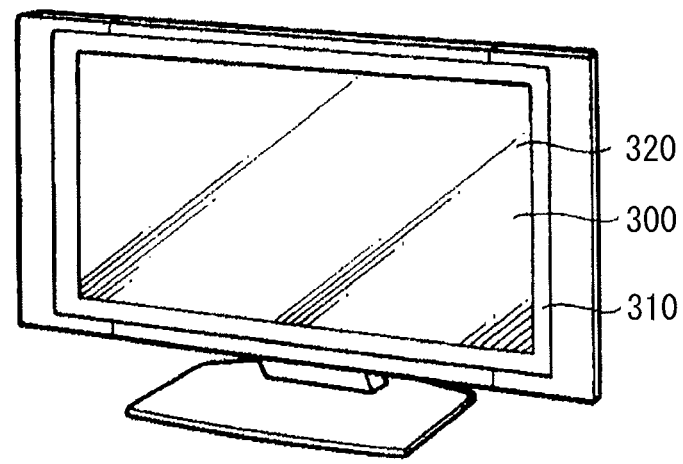
FIG. 10 is a perspective view showing an external appearance of an application example 2.

FIG. 10 shows an external appearance of a television. This television is provided with, for example, an image display screen section 300 including a front panel 310 and a filter glass 320. This image display screen section 300 is configured of the above-mentioned display device 1.

Application Example 3

Figure 11A:
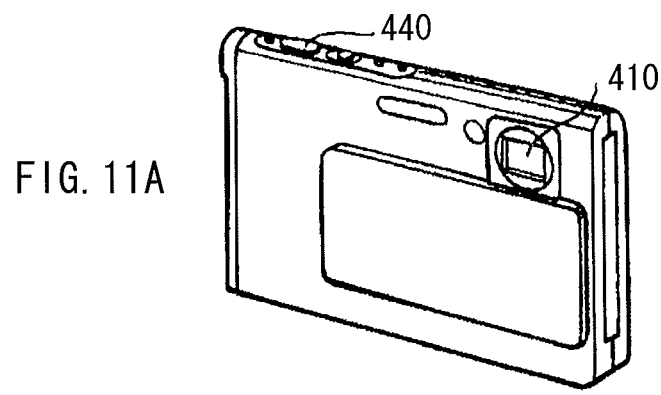
FIG. 11A is a perspective view showing an external appearance of an application example 3 as viewed from a front side.
Figure 11B:
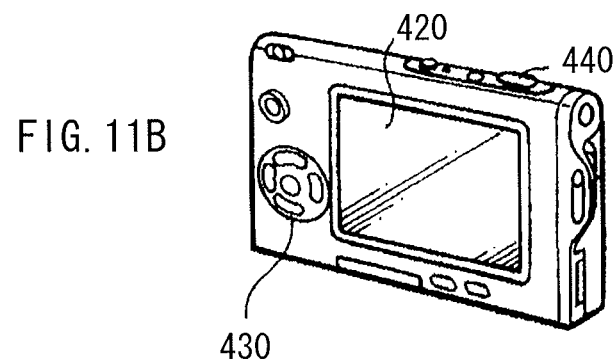
FIG. 11B is a perspective view showing an external appearance thereof as viewed from a rear side.

FIGS. 11A and 11B each show an external appearance of a digital still camera. This digital still camera includes, for example, a light emitting section 410 for flash light, a display section 420, a menu switch 430, and a shutter button 440. This display section 420 is configured of the above-mentioned display device 1.

Application Example 4

Figure 12:
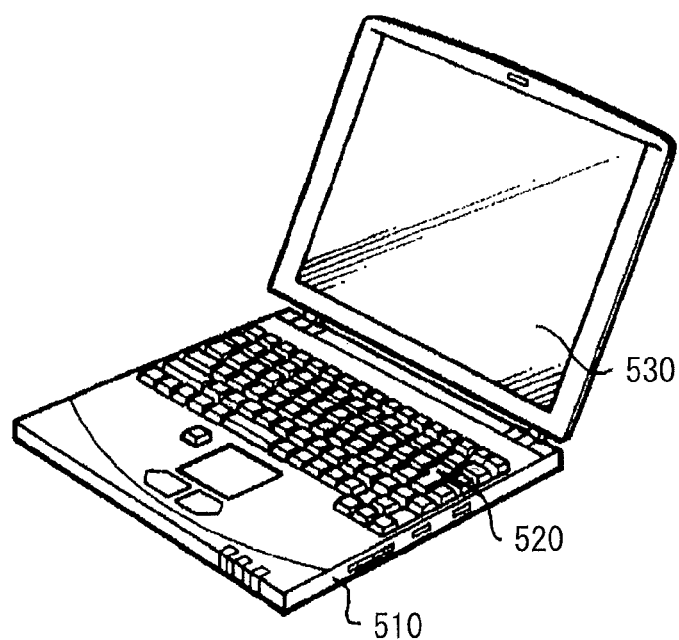
FIG. 12 is a perspective view showing an external appearance of an application example 4.

FIG. 12 shows an external appearance of a notebook personal computer. This notebook personal computer includes, for example, a main body 510, a keyboard 520 configured to input letters and the like, and a display section 530 configured to display an image. This display section 530 is configured of the above-mentioned display device 1.

Application Example 5

Figure 13:
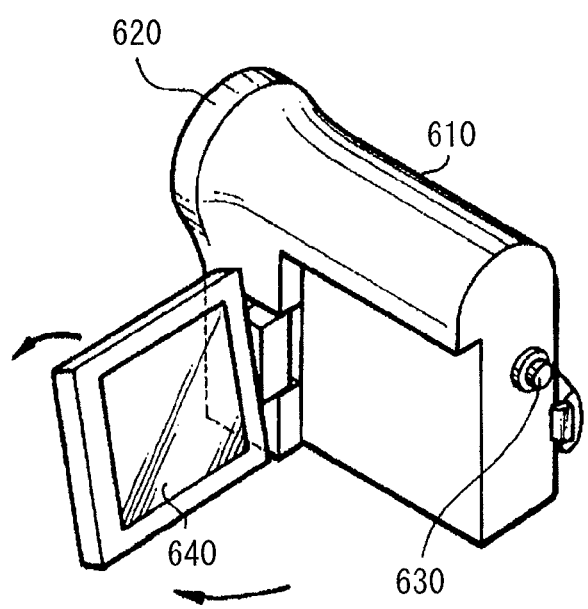
FIG. 13 is a perspective view showing an external appearance of an application example 5.

FIG. 13 shows an external appearance of a video camcorder. This video camcorder includes, for example, a main body section 610, a lens 620 that is provided on a front face of the main body section 610 to take an image of a subject, a start-and-stop switch 630 for capturing an image, and a display section 640. This display section 640 is configured of the above-mentioned display device 1.

Application Example 6

FIGS. 14A to 14G each show an external appearance of a mobile phone. This mobile phone includes, for example, an upper side housing 710, a lower side housing 720, a coupling section (hinge section) 730 coupling the upper side housing 710 and the lower side housing 720, a display 740, a sub-display 750, a picture light 760, and a camera 770. The display 740, the sub-display 750, or both are configured of the above-mentioned display device 1.

While the present technology is described with reference to the embodiment, the present technology is not limited to the above-mentioned embodiment and so forth, and various modifications may be made. For example, while the case where the display device 1 is of an active matrix type including the TFT layer 12 is described in the above-mentioned embodiment and so forth, the display device 1 may be of a passive matrix type.

In addition, the material and thickness of the layers, the film formation method, the film formation condition, and the like described in the above-mentioned embodiment and so forth are not limitative. Other materials, other thicknesses, other film formation methods, and other film formation conditions may be adopted.

Further, while the configuration of the display device 1 has been described in detail in the above-mentioned embodiment and so forth, other layers may be further included.

It is possible to achieve at least the following configurations from the above-described example embodiment of the disclosure.

(1) A driving substrate including:

a protective layer including an etching surface; and a film layer including one or more convex portions on a surface thereof, the film layer being in contact with a rear surface of the protective layer, the one or more convex portions each having a surface being flush with the etching surface.

(2) The driving substrate according to (1), wherein the protective layer is buried between the one or more convex portions of the film layer.

(3) The driving substrate according to (1) or (2), wherein the film layer and the protective layer have substantially same etching resistance.

(4) The driving substrate according to any one of (1) to (3), wherein a material configuring the protective layer and a material configuring the film layer have a same skeleton.

(5) The driving substrate according to any one of (1) to (4), wherein the protective layer is made of a resist.

(6) The driving substrate according to any one of (1) to (5), further including a thin film transistor as a driving circuit on the etching surface.

(7) A display device with a driving substrate and a display layer, the driving substrate including:

a protective layer including an etching surface; and a film layer including one or more convex portions on a surface thereof, the film layer being in contact with a rear surface of the protective layer, the one or more convex portions each having a surface being flush with the etching surface.

(8) A planarizing method including:

forming a substrate by providing a protective layer on a film layer, the protective layer and the film layer having substantially same etching resistance, and the film layer including one or more convex portions on a surface thereof; and planarizing a surface of the substrate by etching the one or more convex portions of the film layer together with the protective layer.

(9) A method of manufacturing a driving substrate, the method including:

forming a substrate by providing a protective layer on a film layer, the protective layer and the film layer having substantially same etching resistance, and the film layer including one or more convex portions on a surface thereof; and planarizing a surface of the substrate by etching the one or more convex portions of the film layer together with the protective layer; and forming a driving circuit on the planarized surface of the substrate.

(10) The method according to (9), further including removing the protective layer after the planarizing of the surface of the substrate.

(11) The method according to (9), wherein the protective layer is completely removed together with the one or more convex portions.

(12) The method according to any one of (9) to (11), further including fixing an entire rear surface of the film layer to a supporting substrate before the forming of the substrate.

The present disclosure contains subject matter related to that disclosed in Japanese Priority Patent Application JP 2011-273548 filed in the Japan Patent Office on Dec. 14, 2011, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A planarizing method comprising:
    forming a substrate by providing a protective layer on a film layer, wherein the film layer comprises one or more convex portions on a surface thereof, and the film layer and the protective layer have substantially same etching resistance; and
    planarizing a surface of the substrate by etching the one or more convex portions of the film layer together with the protective layer.

2. The method according to claim 1, further comprising removing the protective layer after the planarizing of the surface of the substrate.

3. The method according to claim 2, wherein the protective layer is completely removed together with the one or more convex portions.

4. The method according to claim 1, further comprising fixing an entire rear surface of the film layer to a supporting substrate before forming the substrate.

5. A method of manufacturing a driving substrate, the method comprising:
    forming a substrate by providing a protective layer on a film layer, wherein the film layer comprises one or more convex portions on a surface thereof, and the film layer and the protective layer have substantially same etching resistance;
    planarizing a surface of the substrate by etching the one or more convex portions of the film layer together with the protective layer; and
    forming a driving circuit on the planarized surface of the substrate.

6. The method according to claim 5, further comprising removing the protective layer after the planarizing of the surface of the substrate.

7. The method according to claim 6, wherein the protective layer is completely removed together with the one or more convex portions.

8. The method according to claim 5, further comprising fixing an entire rear surface of the film layer to a supporting substrate before forming the substrate.

9. The method according to claim 8, wherein the surface of the film layer is bonded to the supporting substrate using an adhesive agent.

10. The method according to claim 5, wherein the protective layer is formed on the film layer by one of: a spin coating method or a slit coating method.

11. The method according to claim 5, wherein an etching surface is formed on the protective layer based on the etching.

12. The method according to claim 11, wherein the film layer is in contact with a rear surface of the protective layer, the one or more convex portions each having a surface being flush with the etching surface, and
    wherein a material configuring the protective layer and a material configuring the film layer have a same skeleton.

13. The method according to claim 5, wherein the protective layer is disposed between the one or more convex portions of the film layer.

14. The method according to claim 13, wherein the driving substrate comprises a thin film transistor as a driving circuit on the etching surface.

15. The method according to claim 5, wherein the driving substrate comprises a thin film transistor (TFT) layer as the driving circuit.

* * * * *